United States Patent
Riho

(10) Patent No.: US 7,642,843 B2
(45) Date of Patent: Jan. 5, 2010

(54) REFERENCE VOLTAGE GENERATING CIRCUIT AND SEMICONDUCTOR INTEGRATED CIRCUIT DEVICE

(75) Inventor: Yoshiro Riho, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 128 days.

(21) Appl. No.: 12/018,375

(22) Filed: Jan. 23, 2008

(65) Prior Publication Data

US 2008/0211572 A1   Sep. 4, 2008

(30) Foreign Application Priority Data

Jan. 23, 2007   (JP) ............................. 2007-013178

(51) Int. Cl.
*G05F 1/10* (2006.01)
(52) U.S. Cl. ...................... 327/543; 327/537
(58) Field of Classification Search ................. 327/537, 327/538, 543, 540, 541
See application file for complete search history.

(56) References Cited

U.S. PATENT DOCUMENTS

| | | | | |
|---|---|---|---|---|
| 5,942,933 | A * | 8/1999 | Yang | ........................... 327/530 |
| 6,097,257 | A | 8/2000 | Kadowaki et al. | |
| 6,288,600 | B1 | 9/2001 | Kadowaki et al. | |
| 6,297,624 | B1 | 10/2001 | Mitsui et al. | |
| 7,282,989 | B2 * | 10/2007 | Byeon | ........................ 327/541 |
| 7,301,322 | B2 * | 11/2007 | Choi | ........................... 323/315 |
| 7,479,821 | B2 * | 1/2009 | Imura | ........................ 327/538 |
| 2001/0043106 | A1 | 11/2001 | Kadowaki et al. | |
| 2001/0052809 | A1 | 12/2001 | Kadowaki et al. | |
| 2002/0070792 | A1 | 6/2002 | Nakamiya et al. | |
| 2003/0081484 | A1 | 5/2003 | Kobayashi et al. | |

FOREIGN PATENT DOCUMENTS

| | | |
|---|---|---|
| JP | 59-135520 | 8/1984 |
| JP | 2000-011649 A | 1/2000 |
| JP | 2001-312320 | 11/2001 |
| JP | 2003-132678 | 5/2003 |

OTHER PUBLICATIONS

Japanese Official Action, 2007-013178, Nov. 13, 2008.
Japanese Patent Office issued a Japanese Office Action dated Mar. 17, 2009, Application No. 2007-013178.

* cited by examiner

*Primary Examiner*—Lincoln Donovan
*Assistant Examiner*—Hai L Nguyen
(74) *Attorney, Agent, or Firm*—Young & Thompson

(57) ABSTRACT

A reference voltage generating circuit comprises: a monitor circuit, including a low threshold voltage PMOS transistor, a low threshold voltage NMOS transistor, and a resistor having a predetermined resistance which are connected in series, for generating a reference voltage at one end; and an additional circuit for supplying a monitor current to the monitor circuit and for controlling the other end of the monitor circuit to be at a constant voltage, wherein a voltage value of the reference voltage is corrected within a range corresponding to a process fluctuation from a predetermined center value, based on the monitor current changing in response to the process fluctuation.

15 Claims, 13 Drawing Sheets

REFERENCE VOLTAGE GENERATING CIRCUIT

|  | −5°C | 110°C |
|---|---|---|
| LOW Vt PMOS TRANSISTOR (W/L) | 4.5 μm/0.25 μm | 1.2 μm/0.25 μm |
| LOW Vt NMOS TRANSISTOR (W/L) | 1.5 μm/0.18 μm | 0.4 μm/0.18 μm |
| RESISTOR (RESISTANCE VALUE) | 100kΩ | 300kΩ |

FIG.5

OPERATING CONDITIONS OF THE MONITOR CIRCUIT (-5°C)

|       | SLOW MODEL | TYPICAL MODEL | FAST MODEL |
|-------|------------|---------------|------------|
| VCLR  | 1.5V | 1.4V | 1.3V |
| $\Delta VP$ | RP(slow)·0.42$\mu$ | RP(typ)·0.55$\mu$ | RP(fast)·0.75$\mu$ |
| $\Delta VN$ | RN(slow)·0.42$\mu$ | RN(typ)·0.55$\mu$ | RN(fast)·0.75$\mu$ |
| $\Delta VR$ | R·0.42$\mu$ | R·0.55$\mu$ | R·0.75$\mu$ |
| VFQ   | 0.7V | 0.7V | 0.7V |
| IR    | 0.42$\mu$A | 0.55$\mu$A | 0.75$\mu$A |

FIG.12A

EFFECT OF THE EMBODIMENT (DELAY TIME IN SELECTING A BIT LINE)

| DELAY ELEMENT | LOW Vt TRANSISTOR (IN THE EMBODIENT) | | | | STANDARD Vt TRANSISTOR (CONVENTIONAL METHOD) | |
|---|---|---|---|---|---|---|
| | SLOW MODEL | | FAST MODEL | | SLOW | FAST |
| | −5°C | 110°C | −5°C | 110°C | 110°C | −5°C |
| T1 (BANK SELECTION) | 2.57ns | 2.5ns | 2.1ns | 2.09ns | 2.09ns | 1.6ns |
| T2 (X DECODER INPUT) | 3.62ns | 3.5ns | 2.9ns | 3.05ns | 3.05ns | 2.4ns |
| T3 (WORD LINE SELECTION) | 4.19ns | 5ns | 3.6ns | 4.3ns | 4.3ns | 3.4ns |
| T4 (SENSE AMPLIFIER START-UP) | 5.1ns | 4.7ns | 3.9ns | 3.9ns | 3.9ns | 3.35ns |
| T5 (BIT LINE SELECTION) | 1.84ns | 1.84ns | 1.1ns | 1.11ns | 1.11ns | 0.7ns |
| Ta1 (T1+T2+T3+T4+T5) | 17.32ns | 17.32ns | 13.6ns | 14.45ns | 14.45ns | 11.45ns |
| T6 (READ TIMING) | 5.9ns | 5.9ns | 4.8ns | 4.8ns | 4.8ns | 4.7ns |
| tRCD (Ta1−T6) | 11.42ns | 11.42ns | 8.8ns | 9.65ns | 9.65ns | 6.75ns |

FIG.12B

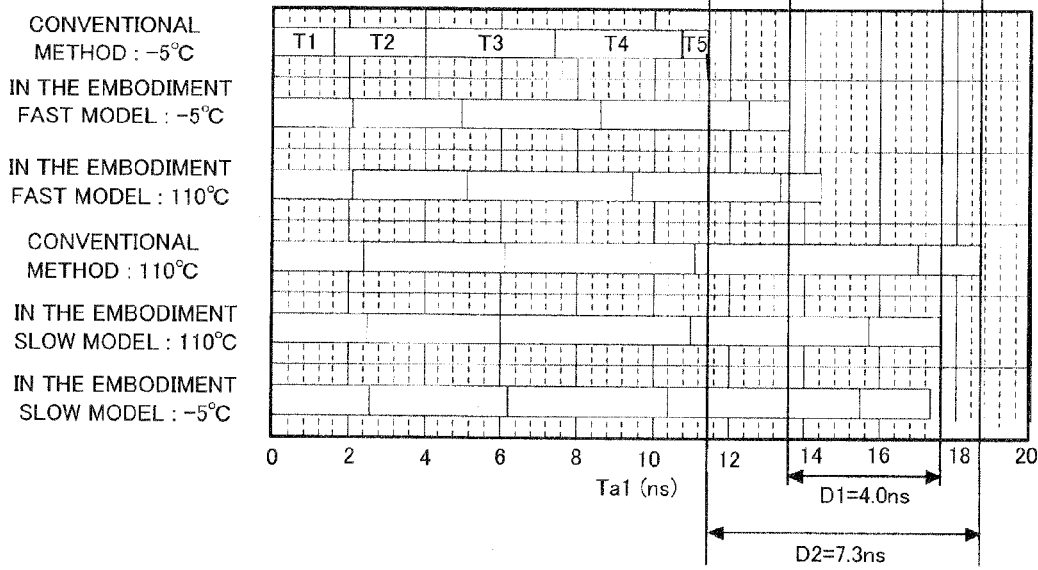

FIG.13A

EFFECT OF THE EMBODIMENT (DELAY TIME IN PRECHARGING A BIT LINE)

| DELAY ELEMENT | LOW Vt TRANSISTOR (IN THE EMBODIMENT) | | | | STANDARD Vt TRANSISTOR (CONVENTIONAL METHOD) | |
|---|---|---|---|---|---|---|
| | SLOW MODEL | | FAST MODEL | | SLOW | FAST |
| | −5°C | 110°C | −5°C | 110°C | 110°C | −5°C |
| T11 (BANK SELECTION) | 4.8ns | 4.8ns | 3.8ns | 3.9ns | 4.3ns | 2.8ns |
| T12 (X DECODER CONTROL) | 7.4ns | 7.2ns | 5.9ns | 6ns | 7.5ns | 4.7ns |
| T13 (PRECHARGE CONTROL) | 2ns | 2.2ns | 1.7ns | 1.9ns | 2.2ns | 1.4ns |
| T14 (BIT LINE PRECHARGE) | 3.2ns | 4.7ns | 3.7ns | 4.3ns | 5.3ns | 3.8ns |
| Ta2 (T11+T12+T13+T14) | 17.4ns | 18.9ns | 14.5ns | 16.1ns | 19.3ns | 12.7ns |
| T15 (TURNING OFF THE PRECHARGE CONTROL) | 7.8ns | 7.9ns | 6.3ns | 6.7ns | 8.1ns | 5.3ns |
| tRP (Ta2−T15) | 9.6ns | 11ns | 8.2ns | 9.4ns | 11.2ns | 7.4ns |

FIG.13B

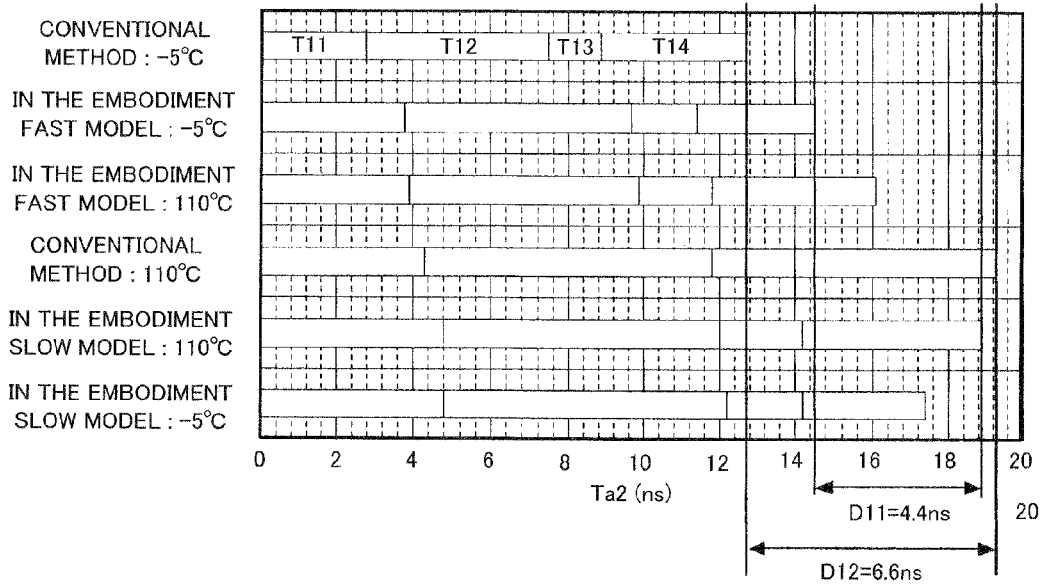

REFERENCE VOLTAGE GENERATING CIRCUIT AND SEMICONDUCTOR INTEGRATED CIRCUIT DEVICE

BACKGROUND OF THE INVENTION

1. Field of the Invention

The present invention relates to a technical field of a semiconductor integrated circuit device configured using a large number of MOS transistors, and particularly relates to a technical field of a semiconductor memory device such as a DRAM (Dynamic Random Access Memory) which is accessed through a signal path using a large number of MOS transistors.

2. Description of the Related Art

In recent years, as performance of a semiconductor integrated circuit device is improved, high speed operation and low voltage operation are required. Particularly, a semiconductor memory such as a DRAM has enabled high frequency operation, high speed access and low voltage operation due to finer manufacturing process, and higher performance is strongly required (e.g., see Japanese Patent Application Laid-open No. 2000-11649). Generally, complex operation needs to be performed when accessing the semiconductor memory, and delay time for the operation should be considered. In this case, if the delay time is constant for each of a large number of manufactured semiconductor memories, no problem arises. However, the delay time actually varies for each semiconductor memory due to process fluctuation. Such fluctuation of the delay time is further increased due to temperature fluctuation in addition to the process fluctuation. Then, delay difference when comparing a condition to maximize the delay time and a condition to minimize the delay time is increased, and this causes a problem of an increase in error of an access time for the semiconductor memory.

Meanwhile, as a measure against the operation delay, a method is known in which low threshold voltage transistors (low Vt transistors) having a threshold voltage (Vt) set lower than a standard value are used in a circuit contributing to the access time. By using such low Vt transistors, the delay time associated with the access time can be improved by about 10% relative to general transistors, and the fluctuation of the delay time can be slightly reduced.

However, variations of the low Vt transistor characteristics due to the process fluctuation causes various problems in the above conventional method. When the threshold voltage of the low Vt transistor varies downward, the operation delay is reduced, but both operation current and leak current are increased, thereby increasing consumption current. Meanwhile, when the threshold voltage of the low Vt transistor varies upward, the consumption current is reduced, but the operation delay is increased. In this case, if a power supply voltage of the low Vt transistors is lowered for the purpose of a reduction in the consumption current, the influence of the variation of the above threshold voltage is relatively increased, thereby further increasing the fluctuation of the delay time of the circuit. If the circuit is operated within a relatively wide temperature range, the influence of the variation of the low Vt transistor characteristics is remarkable due to both the process fluctuation and the temperature fluctuation. In this manner, it is a problem that in the conventional semiconductor integrated circuit device, it is difficult to reduce the fluctuation of the delay time in the circuit due to the process fluctuation and the temperature fluctuation without an increase in the consumption current, and the error of the access time or the like occurs.

BRIEF SUMMARY OF THE INVENTION

An object of the present invention is to provide a reference voltage generating circuit and a semiconductor integrated circuit device capable of reducing fluctuation of delay time while suppressing consumption current, in which a reference voltage corrected to reduce an influence of the variation of characteristics due to process fluctuation and temperature fluctuation is generated in a circuit using low Vt transistors.

An aspect of the present invention is a reference voltage generating circuit comprising: a monitor circuit, including a low threshold voltage PMOS transistor, a low threshold voltage NMOS transistor, and a resistor having a predetermined resistance which are connected in series, for generating a reference voltage at one end; and an additional circuit for supplying a monitor current to said monitor circuit and for controlling the other end of said monitor circuit to be at a constant voltage, wherein a voltage value of the reference voltage is corrected within a range corresponding to a process fluctuation from a predetermined center value, based on the monitor current changing in response to the process fluctuation.

According to the reference voltage generating circuit of the present invention, a pair of low threshold voltage MOS transistors included in the monitor circuit has different characteristics of the threshold voltage and the current, which is cause by the process fluctuation, and thus the monitor current and a voltage drop of the monitor circuit change according to the characteristics. Then, the reference voltage generated at one end of the monitor circuit is corrected within a predetermined range from the predetermined center value according to the change of the voltage drop using the constant voltage as a reference at the other end of the monitor circuit. At this point, by appropriately adjusting design conditions of the pair of low threshold voltage MOS transistors and the resistor, consumption current and delay characteristics of the low threshold voltage MOS transistors can be appropriately controlled by the correction of the reference voltage. Then, when a circuit including the low threshold voltage MOS transistors is operated using the reference voltage, fluctuation of the delay time due to the process fluctuation can be reduced while suppressing the consumption current.

In the reference voltage generating circuit of the present invention, sizes of the low threshold voltage PMOS and NMOS transistors may be adjusted beforehand so that the reference voltage is increased by a predetermined amount when operation delay is increased due to the process fluctuation while the reference voltage is reduced by a predetermined amount when the operating delay is reduced due to the process fluctuation.

In the reference voltage generating circuit of the present invention, the low threshold voltage PMOS and NMOS transistors may have commonly connected gates and commonly connected drains An aspect of the present invention is a semiconductor integrated circuit device comprising: an internal circuit, to which an internal power supply voltage is supplied, including a low threshold voltage MOS transistor; a temperature sensor circuit for detecting a temperature within a predetermined temperature range; and a reference voltage generating circuit, each adjusted corresponding to the temperature detected by said temperature sensor circuit, each for generating a reference voltage used as a reference for said internal circuit, wherein each of said plurality of reference voltage generating circuits includes: a monitor circuit, including a low threshold voltage PMOS transistor, a low threshold voltage NMOS transistor, and a resistor having a predetermined resistance which are connected in series, for generating a reference voltage at one end; and an additional circuit for supplying a monitor current to said monitor circuit and for controlling the other end of said monitor circuit to be at a constant voltage, and in said reference voltage generating circuit, a voltage value of the reference voltage is corrected within a range corresponding to a process fluctuation from a predetermined center value, based on the monitor current changing in response to the process fluctuation.

According to the semiconductor integrated circuit device of the present invention, the temperature sensor circuit and the plurality of reference voltage generating circuits are provided, each of the reference voltage generating circuits is adjusted corresponding to the temperature detected by the temperature sensor circuit, and each of the reference voltage generating circuits is selectively operated corresponding to a detected result. Thus, it is possible to suppress an increase in consumption current and fluctuation of the delay time due to an influence of temperature fluctuation in addition to the process fluctuation in the semiconductor integrated circuit device.

In the semiconductor integrated circuit device of the present invention, said temperature sensor circuit may detect the temperature as a binary value with a boundary at a predetermined temperature, a first said reference voltage generating circuit adjusted corresponding to low temperatures and a second said reference voltage generating circuit adjusted corresponding to high temperatures may be provided, and the first said reference voltage generating circuit may be operated when a low temperature is detected by the temperature sensor circuit while the second said reference voltage generating circuit may be operated when a high temperature is detected by the temperature sensor circuit.

In the semiconductor integrated circuit device of the present invention, the first and second said reference voltage generating circuits may be adjusted beforehand based on sizes of the low threshold voltage PMOS and NMOS transistors and the predetermined resistance value of the resistor.

In the semiconductor integrated circuit device of the present invention, sizes of the low threshold voltage PMOS and NMOS transistors may be adjusted before hand so that the reference voltage is increased by a predetermined amount when operation delay is increased due to the process fluctuation while the reference voltage is reduced by a predetermined amount when the operating delay is reduced by the process fluctuation.

In the semiconductor integrated circuit device of the present invention, said internal circuit may include a delay circuit including the low threshold voltage MOS transistor to which the internal power supply voltage is supplied.

The semiconductor integrated circuit device of the present invention may further comprises a memory circuit for storing data, in which said internal circuit is a circuit including an access path to said memory circuit.

As described above, according to the reference voltage generating circuit of the present invention, a monitor circuit including a pair of low threshold voltage MOS transistors is appropriately adjusted, a voltage value of a reference voltage generated at one end according to a change of a monitor current can be automatically corrected, and fluctuation of a delay time due to process fluctuation and an increase in consumption current can be suppressed. Further, according to the semiconductor integrated circuit device of the present invention, a plurality of the reference voltage generating circuits is provided corresponding to temperatures, and each reference voltage generating circuit is selectively operated corresponding to a detected result of the temperature sensor circuit. Therefore, in a circuit to which an internal power supply voltage based on the reference voltage is supplied, it is possible to suppress an increase in consumption current and fluctuation of the delay time due to temperature fluctuation in addition to process fluctuation. Particularly, when the present invention is applied to an access path in the semiconductor integrated circuit device including a memory circuit, malfunction due to an error of an access time can be prevented by reducing the fluctuation of the delay time.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 5 is a diagram showing a model of operating conditions of a monitor circuit according to process fluctuation;

FIGS. 12A and 12B are diagrams explaining the delay time regarding bit line select operation of the DRAM; and FIGS. 13A and 13B are diagrams explaining the delay time regarding bit line precharge operation of the DRAM.

DETAILED DESCRIPTION OF THE INVENTION

A preferred embodiment of the present invention will be described with reference to the accompanying drawings. In the embodiment, a case of applying the present invention to a DRAM as a semiconductor integrated circuit device will be described.

Figure 1:
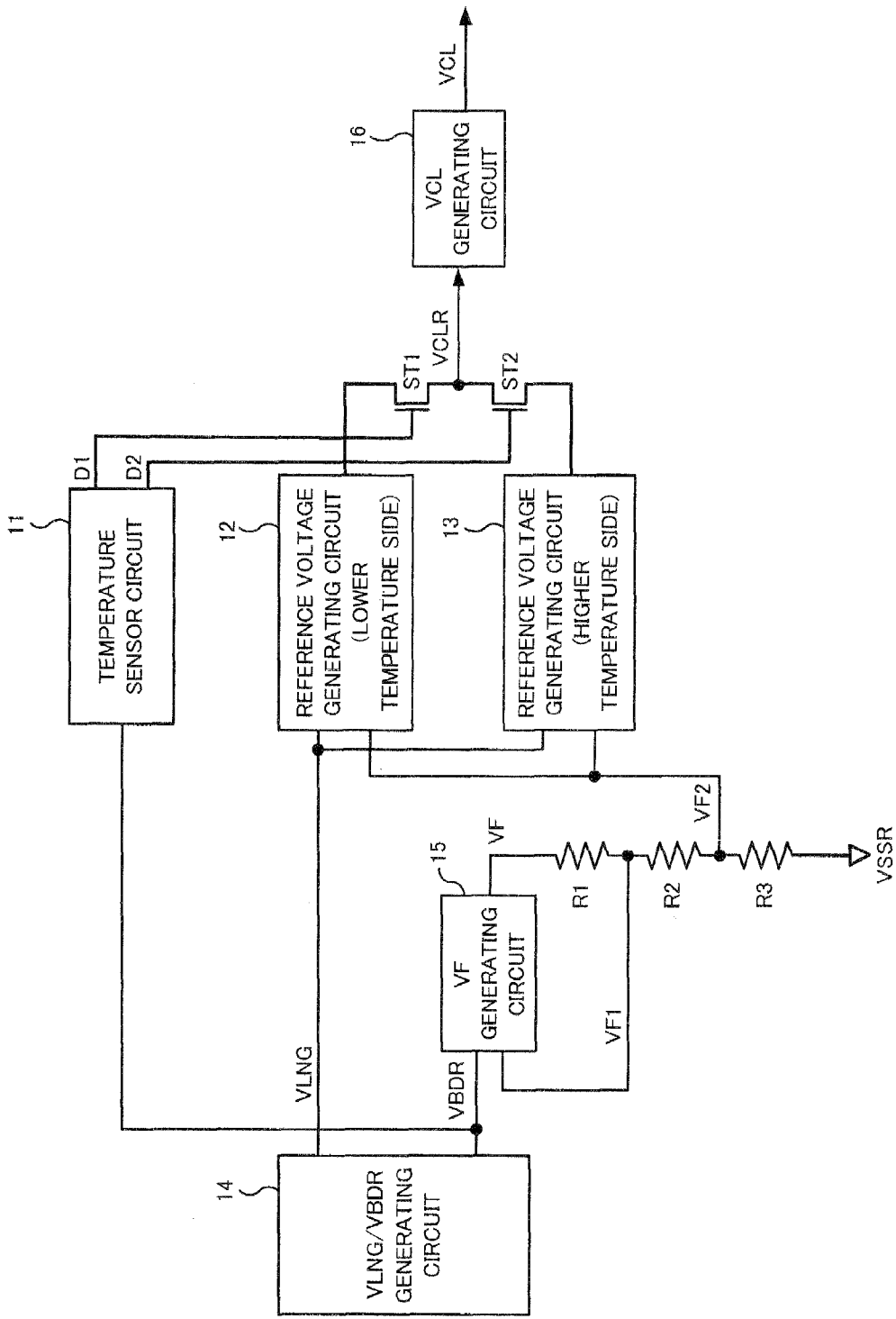
FIG. 1 is a block diagram showing a configuration of a principal part in a DRAM of an embodiment.

FIG. 1 is a block diagram showing a configuration of a principal part for correcting a reference voltage VCLR in the DRAM of the embodiment. The reference voltage VCLR is used as a reference for an internal power supply voltage VCL supplied to principal circuits of the DRAM of the embodiment. The principal part as shown in FIG. 1 includes a temperature sensor circuit 11, two reference voltage generating circuits 12 and 13, a VLNG/VBDR generating circuit 14, a VF generating circuit 15, a VCL generating circuit 16, two switch transistors ST1 and ST2, and three resistors R1, R2 and R3.

In the above configuration, the temperature sensor circuit 11 detects a temperature as a binary value indicating a high temperature or a low temperature within a predetermined temperature range based on a specification of the DRAM, and selectively activates and outputs a detection signal D1 for low temperatures or a detection signal D2 for high temperatures. The specification of the DRAM specifies, for example, a temperature range between −5 to 110 degree, and the temperature sensor circuit 11 detects the binary value of the temperature with a boundary at about 60 degree. The detection signal D1 for the low temperatures is input to the gate of the switch transistor ST1, the detection signal D2 for the high temperatures is input to the gate of the switch transistor ST2, and one of the two switch transistors ST1 and ST2 is turned on.

The reference voltage generating circuit 12 generates a reference voltage VCLR having a voltage value corrected according to process fluctuation of a low Vt transistor. A reference voltage generating circuit 12 on the low temperature side (for example, −5 to 60 degree) and a reference voltage generating circuit 13 on the high temperature side (for example, 60 to 110 degree) are arranged in parallel in order to correct the influence of the temperature variations of the low Vt transistors. Then, the reference voltage generating circuit 12 on the low temperature side is connected to one switch transistor ST1, the reference voltage generating circuit 13 on the high temperature side is connected to the other switch transistor ST2, and the reference voltage VCLR is output from an intermediate node between the two switch transistors ST1 and ST2.

When the temperature sensor circuit 11 detects a temperature on the low temperature side, the reference voltage VCLR is output from the reference voltage generating circuit 12 on the low temperature side through the switch transistor ST1. When the temperature sensor circuit 11 detects a temperature on the high temperature side, the reference voltage VCLR is output from the reference voltage generating circuit 13 on the high temperature side through the switch transistor ST2. Meanwhile, the VCL generating circuit 16 generates the internal power supply voltage VCL having the same voltage value as the reference voltage VCLR based on the input reference voltage VCLR, and supplies it to an internal circuit of each part of the DRAM. Specific configuration and operation of the temperature sensor circuit 11 and the reference voltage generating circuits 12 and 13 will be described later.

The VLNG/VBDR generating circuit 14 generates constant voltages VLNG and VBDR as high precision band-gap voltages which are not affected by the temperature fluctuation and the process fluctuation. The VLNG/VBDR generating circuit 14 supplies the constant voltage VLNG to the two reference voltage generating circuits 12 and 13, and supplies the constant voltage VBDR to the temperature sensor circuit 11 and the VF generating circuit 15. The VF generating circuit 15 generates a constant voltage VF based on the constant voltage VBDR, and generates constant voltages VF1 and VF2 at respective nodes of the resistors R1, R1 and R3 between the output side of the VF generating circuit 15 and a ground potential VSSR. The constant voltage VF1 is fed back to the input side of the VF generating circuit 15, and the constant voltage VF2 is supplied to the two reference voltage generating circuits 12 and 13. For example, VBDR=1.2V, VLNG=0.66V, VF=1.4V, VF1=1.2V, VF2=0.7V are respectively set.

Figure 2:
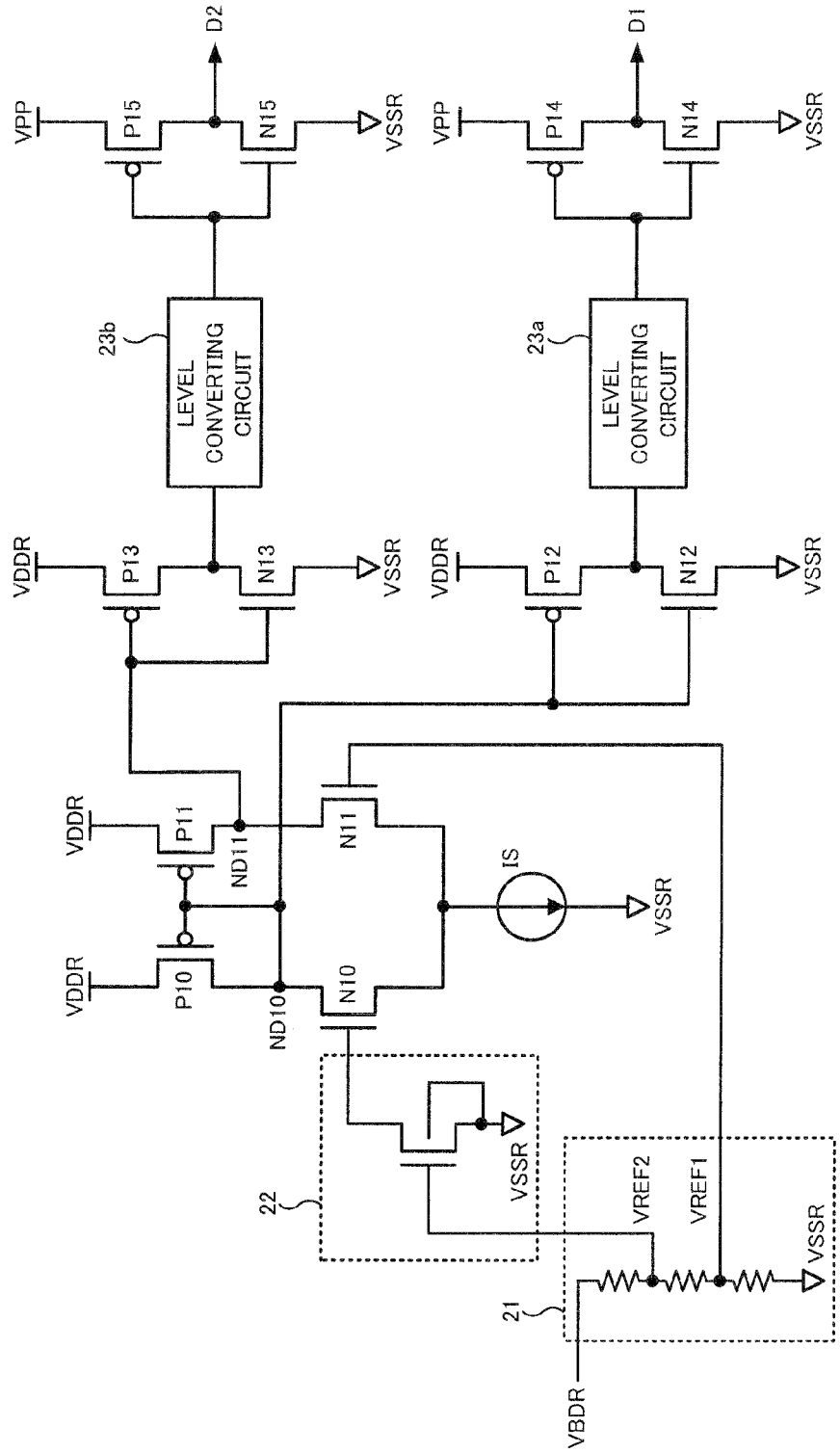
FIG. 2 is a diagram showing a circuit configuration a temperature sensor circuit of FIG. 1.

Next, a circuit configuration of the temperature sensor circuit 11 of FIG. 1 will be described using FIG. 2. The temperature sensor circuit 11 as shown in FIG. 2 includes a constant voltage generator 21, a temperature-dependent bias element 22, a constant current source IS, six PMOS transistors P10 to P15, six NMOS transistors N10 to N15, and two level converting circuits 23a and 23b. Among these, the constant voltage generator 21 is composed of resistors connected in series between the ground potential VSSR and the constant voltage BVDR supplied from the VLNG/VBDR generating circuit 14. Further, the temperature-dependent bias element 22 is composed of an NMOS transistor connected between the gate of the NMOS transistor N10 and the ground potential VSSR.

The constant voltage generator 21 supplies a reference voltage VREF1 to the gate of the NMOS transistor N11 and supplies a reference voltage VREF2 to the gate of the NMOS transistor of the temperature-dependent bias element 22, respectively, by dividing the constant voltage VBDR by the registers. For example, VREF1=0.5V and VREF2=0.7V are set for VBDR=1.2V. The temperature-dependent bias element 22 changes the gate bias of the NMOS transistor N10 depending on the temperature by utilizing a temperature dependence of characteristics of an NMOS transistor. For example, the bias may be set to be changed in a range lower than 0.5V on the low temperature side and may be set to be changed in a range higher than 0.5V on the high temperature side, within a temperature range between −5 to 110 degree. By adjusting the constant voltage generator 21 and the temperature-dependent bias element 22 in this manner, a desired switching temperature point can be set for the temperature sensor circuit 11.

The PMOS transistors P10, P11 and the NMOS transistor N10, N11 form a differential circuit, and the constant current source IS allows a predetermined current to flow from a power supply voltage VDDR to the ground potential VSSR. By this configuration, respective voltages at two nodes ND10 and ND11 change in response to a relation between magnitudes of the reference voltage VREF1 output from the constant voltage generator 21 and the bias voltage output from the temperature-dependent bias element 22. One node ND10 is connected to gates of the PMOS transistor P12 and the NMOS transistor N12, and the other node ND11 is connected to gates of the PMOS transistor P13 and the NMOS transistor N13. A series circuit composed of the PMOS transistor P12 and the NMOS transistor N12 and a series circuit composed of the PMOS transistor P13 and the NMOS transistor N13 are both connected between the power supply voltage VDDR and the ground potential VSSR. For example, when the switching temperature point is 60 degree, the node ND10 goes high and the node ND11 goes low on the low temperature side, while the node ND10 goes low and the node ND11 goes high on the high temperature side.

The signal from the node ND10 is inverted by the PMOS transistor P12 and the NMOS transistor N12, and the amplitude of the power supply voltage VDDR level is converted to an amplitude of a power supply voltage VPP by the level converting circuit 23a. In the level converting circuit 23a, for example, an amplitude of VDDR=1.8V is converted to an amplitude of VPP=3.2V, and thereby a sufficiently large signal level to reliably turn on the switch transistor ST1 is obtained. The signal whose level has been converted by the level converting circuit 23a is inverted by the PMOS transistor P14 and the NMOS transistor N14 connected in series between the power supply voltage VDDR and the ground potential VSSR, and the above detection signal D1 is output from an intermediate node therebetween. In addition, a circuit portion including the PMOS transistors P13, P15, the NMOS transistor N13, N15 and the level converting circuit 23b respectively on the low temperature side has the same configuration and operation.

Figure 3:
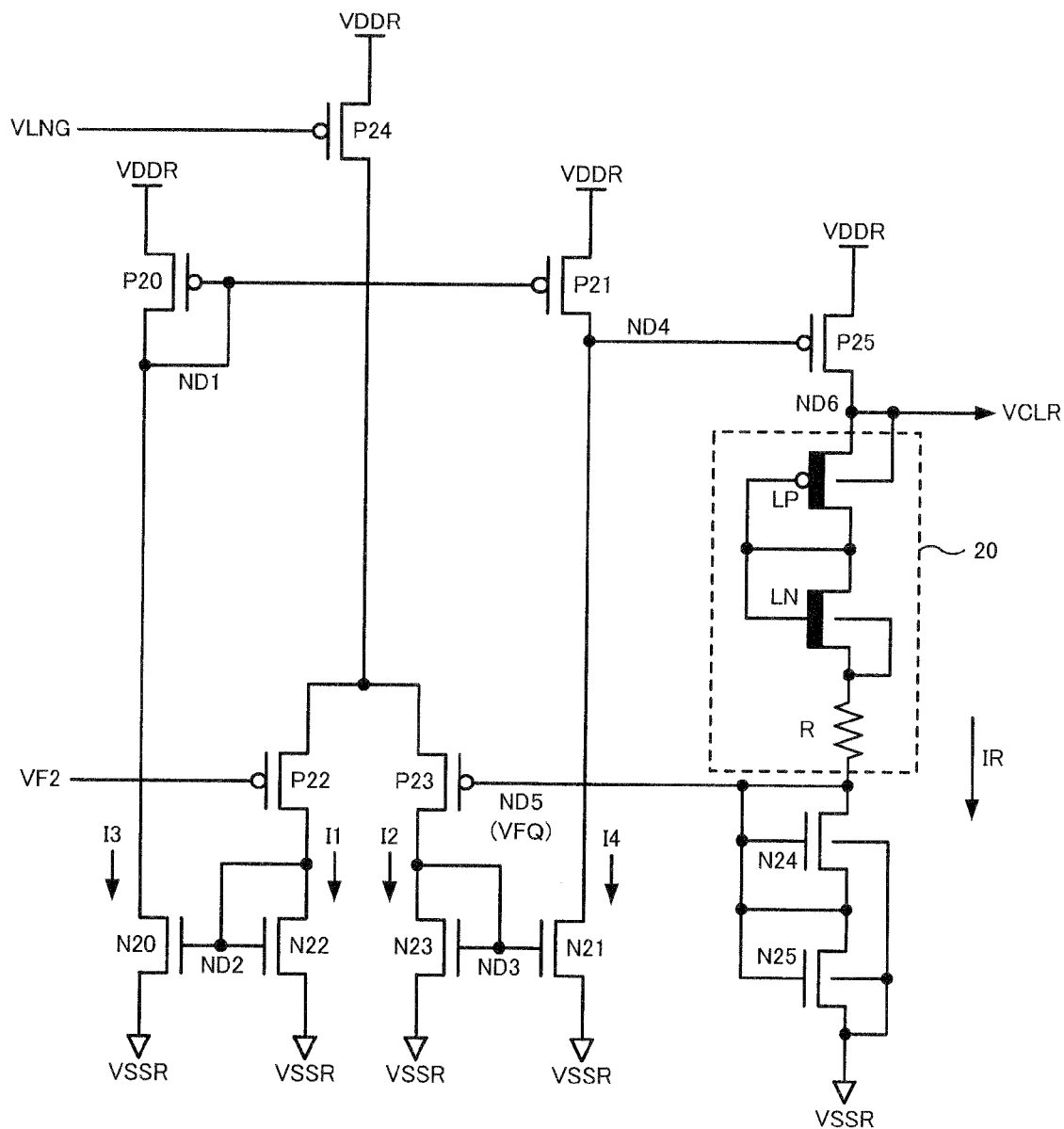
FIG. 3 is a circuit configuration of reference voltage generating circuits of FIG. 1.

Next a circuit configuration of the reference voltage generating circuits 12 and 13 will be described using FIG. 3. Hereinafter, the description will be made by exemplifying the reference voltage generating circuit 12 on the low temperature side, however configuration and operation of the reference voltage generating circuit 13 on the high temperature side are the same. The reference voltage generating circuit 12 as shown in FIG. 3 includes six PMOS transistors P20 to P25, six NMOS transistors N20 to N25, and a monitor circuit 20, and the monitor circuit 20 is configured by connecting a low Vt PMOS transistor LP, a low Vt NMOS transistor LN and a resistor R in series. Note that standard Vt transistors having a standard threshold voltage are used as the PMOS transistors P20 to P25 and the NMOS transistors N20 to N25.

In FIG. 3, the constant voltage VLNG from the VLNG/VBDR generating circuit 14 is applied to the gate of the PMOS transistor P24. Further, the constant voltage VF2 from the VF generating circuit 15 is applied to the gate of the PMOS transistor P22. A first series circuit composed of the PMOS transistor P22 and the NMOS transistor N22 and a second series circuit composed of the PMOS transistor P23 and the NMOS transistor N23 are arranged in parallel between one end of the PMOS transistor P24 and the ground potential VSSR. Then, a current I1 flows into the first series circuit and a current I2 flows into the second series circuit, respectively, from the power supply voltage VDDR through the PMOS transistor P24.

Meanwhile, the NMOS transistors N22 and N20 form a current mirror, and the NMOS transistors N23 and N21 form a current mirror. A third series circuit composed of the PMOS transistor P20 and the NMOS transistor N20, and a fourth series circuit composed of the PMOS transistor P21 and the NMOS transistor N21 are arranged in parallel between the power supply voltage VDDR and the ground potential VSSR. Thus, a current I3 flowing through the third series circuit is equal to the current I1, and a current I4 flowing through the fourth series circuit is equal to the current I2. Further, since the PMOS transistors P20 and P21 form a current mirror, the current I3 is equal to the current I4. As a result, the respective currents I1, I2, I3 and I4 flowing through the first to fourth series circuits are equal to one another.

A node ND4 between the PMOS transistor P21 and the NMOS transistor N21 is connected to the gate of the PMOS transistor P25. The PMOS transistor P25 is connected in series with the low Vt PMOS transistor LP, the low Vt NMOS transistor LN, the resistor R and NMOS transistors N24 and N25 respectively of the monitor circuit 20. This series circuit is arranged between the power supply voltage VDDR and the ground potential VSSR, and a monitor current IR is assumed to flow through this series circuit. Here, the monitor circuit 20 including the low Vt PMOS transistor LP, the low Vt NMOS transistor LN and the resistor R has a function to correct the reference voltage VCLR generated at one end based on the monitor current IR.

A node ND5 between the resistor R and the NMOS transistor N24 is connected to the gate of the PMOS transistor P23. A voltage VFQ of the node ND5 is equal to the constant voltage VF2 because of the symmetry of the circuit configuration, thereby maintaining VFQ=0.7V when VF2=0.7V. The two NMOS transistor N24 and N25 have gates and drains commonly connected to the node ND5, and are back biased by the ground potential VSSR. The NMOS transistors N24 and N25 operates to pull down the monitor current IR while maintaining the constant voltage VFQ.

The corrected reference voltage VCLR is output from a node ND6 between the PMOS transistor P25 and the monitor circuit 20. The low Vt PMOS transistor LP and the low Vt NMOS transistor LN have gates and drains commonly connected to each other, and are back biased by the respective source potentials. The voltage between both ends of the monitor circuit 20 is determined depending on the Vt characteristics of the low Vt PMOS transistor LP and the low Vt NMOS transistor LN and the resistance value of the resistor R, and correspondingly the voltage value of the reference voltage VCLR changes. In the embodiment, the voltage value of the reference voltage VCLR is assumed to be centered at 1.4V while changing within a range of ±0.1V (1.3V to 1.5V) according to the process fluctuation of the low Vt transistors. The design condition for this case will be described later.

In addition, an example of the voltage condition corresponding to the reference voltage VCLR centered at 1.4V in each part of the configuration of FIG. 3 will be shown below. That is, when supplying VF2=0.7V, VLNG=0.66V, VDDR=1.7 to 1.9V (centered at 1.8V) and VSSR=0V from outside, the voltage at the node ND1 is 0.83V, the voltage at nodes ND2 and ND3 are 0.93V, the voltage at the node ND4 is 1.1V, the voltage at the node ND5 (VFQ) is 0.7V, and the above-described reference voltage VCLR changing within the range between 1.3V and 1.5V is generated at the node ND6.

Figures 4A, 4B:
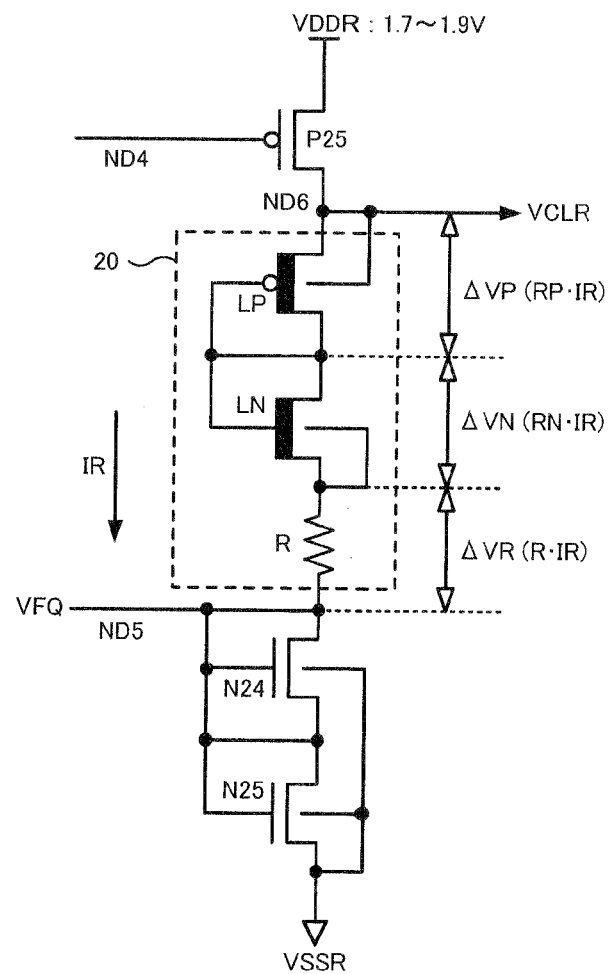
FIGS. 4A and 4B are diagrams explaining design conditions of the reference voltage generating circuits of FIG. 1.

Next, design conditions of the reference voltage generating circuits 12 and 13 will be described using FIGS. 4A and 4B. FIG. 4A is a diagram showing a model of the series circuit including the monitor circuit 20 of FIG. 3. Here, when the monitor current IR flows through the series circuit, a voltage ΔVP is generated at both ends of the low Vt PMOS transistor LP having a resistance value RPΔ (ΔVP=RP·IR), and a voltage ΔVN is generated at both ends of the low Vt NMOS transistor LN having a resistance value RN (ΔVN=RN·IR). Meanwhile, a voltage ΔVR appears at both ends of the resistor R designed to have a predetermined resistance value (represented as R; LVR=R·IR). Accordingly, the voltage value of the reference voltage VCLR at the node ND6 is obtained by adding ΔVP, ΔnVN, ΔVR to the constant voltage VFQ. Note that the respective resistance values RP and RN change according to the process fluctuation of the low Vt PMOS transistor LP and the low Vt NMOS transistor LN.

FIG. 4B shows design conditions for the low Vt PMOS transistor LP, the low Vt NMOS transistor LN, and the resistor R, in a case where the reference voltage generating circuit 12 is adjusted at the lower limit temperature of −5 degree and the reference voltage generating circuit 13 is adjusted at the higher limit temperature of 110 degree, respectively, when the assumed temperature range is within −5 to 110 degree. There are shown sizes of the low Vt PMOS transistor LP and the low Vt NMOS transistor LN (gate width W/gate length L) and resistance values of the resistor R, respectively as the design condition in FIG. 4B. This design condition is an example of a condition to change the reference voltage VCLR within a range from 1.3V to 1.5V for an assumed process fluctuation of the DARM at the respective temperatures.

FIG. 5 shows a model of operating conditions of the monitor circuit 20 according to the process fluctuation. Although, the temperature conditions of both −5 and 110 degree in FIG. 4B are required to be taken into consideration, a case of −5 degree will be described below for the simplicity. In FIG. 5, within a rage of the variations of characteristics of the low Vt transistor, standard characteristics is represented as "typical model", characteristics having a higher Vt and a larger operation delay than the typical model is represented as "slow model", and characteristics having a lower Vt and a smaller operation delay than the typical model is represented as "fast model". Operating conditions obtained by considering the size of the low Vt transistor and the distribution of the characteristics regarding these three models are shown. The constant voltage VFQ (0.7V) and the resistance value (100 kQ) of the resistor R are the same for the three models, however the resistance values RP and RN of the low Vt transistor are different from one another for each model (respectively denoted by "slow", "typ", "fast" in parenthesis). Therefore, the monitor current IR changes because a series resistance of the entire monitor circuit 20 changes.

Figure 6:
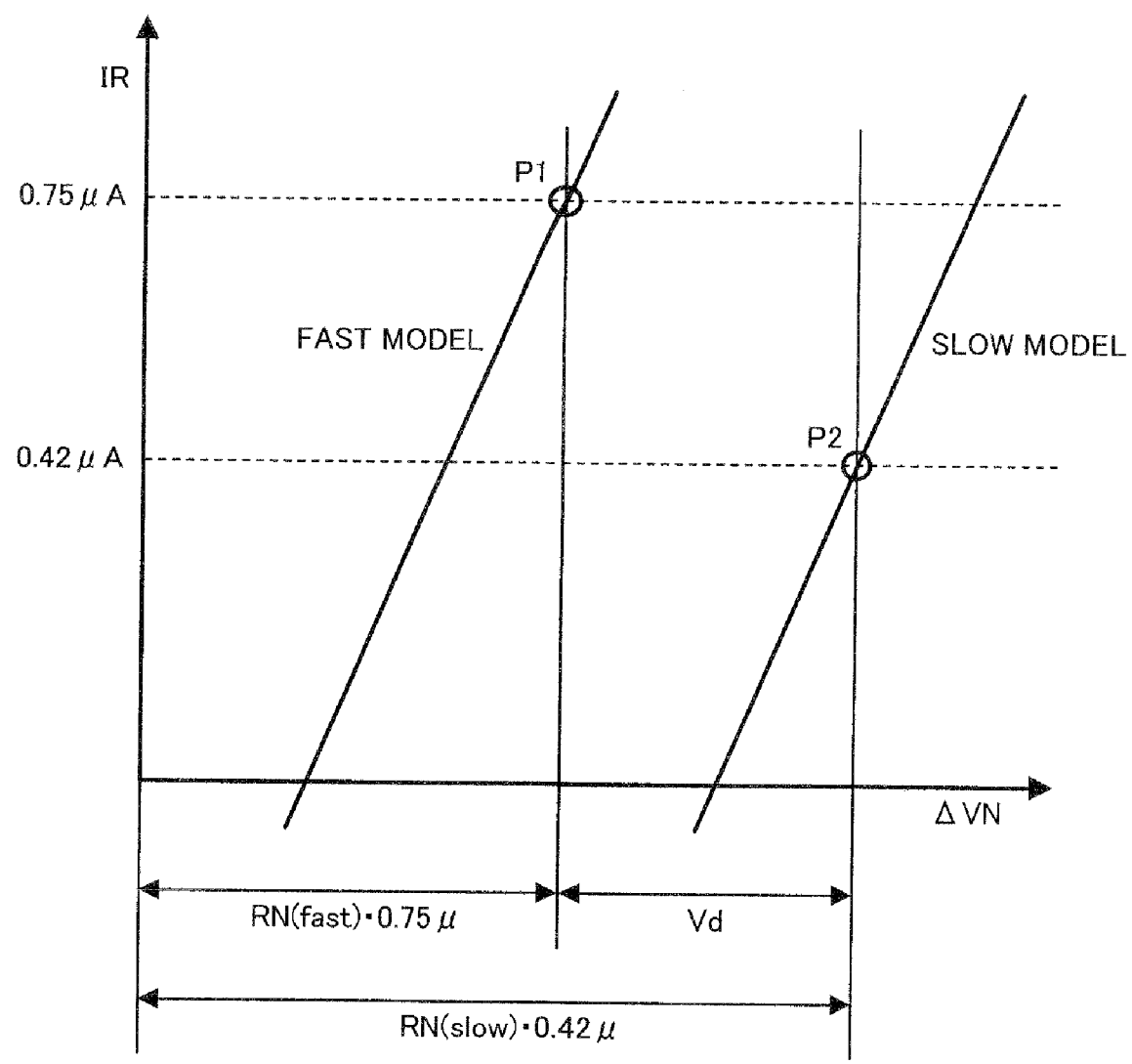
FIG. 6 is a diagram showing a difference between a slow model and a fast model when attention is paid to a voltage ΔVN of a low Vt NMOS transistor LN in FIG. 5.

FIG. 6 is a diagram showing a difference between the slow model and the fast model when attention is paid to the voltage ΔVN of the low Vt NMOS transistor LN in FIG. 5. In comparison with the typical model, the resistance value RN of the low Vt NMOS transistor increases in the slow model, while decreases in the fast model. Accordingly, the voltage value ΔVN of the slow model increases larger than that of the fast model, and the voltage/current line of FIG. 6 shifts in an increasing direction of the horizontal axis. At this point, when applying the condition of the monitor current IR of FIG. 5, a current 0.42 µA is obtained for the slow model, and a current 0.75 µA is obtained for the fast model, so that operating points P1 and P2 are obtained respectively.

By comparing the voltage values ΔVP of the operating points P1 and P2 in FIG. 6, a voltage difference Vd occurs between the slow model and the fast model, which contributes to a difference of the voltage values of the reference voltage VCLR. Although the case of resistance value RN of the low Vt NMOS transistor LN is shown in FIG. 6, the resistance value RP of the low Vt PMOS transistor LP has the same tendency. In this case, the center value (1.4V) of the reference voltage should be adjusted by the resistance value of the resistor R, and thereafter the desired difference of the voltage values (0.2V) of the reference voltage VCLR should by adjusted by the size of the low Vt transistor.

By configuring the monitor circuit 20 according to the above-mentioned design condition, the voltage value of the reference voltage VCLR, which is 1.4V in the typical model, can be increased to 1.5 V in the slow model and reduced to 1.3V in the fast model. Thereby, the variations of characteristics of the low Vt transistors can be suppressed, and the fluctuation of characteristics of delay time and the like can be also suppressed in a circuit to which the internal power supply voltage VCL changing in the same manner as the reference voltage VCLR is supplied. That is, when the operation delay of the low Vt transistor varies in an increasing direction, a reduce of the monitor current IR can be suppressed to some extent because the voltage value is increased by 0.1V, so that the increase in the delay time can be suppressed. Reversely, when the operation delay of the low Vt transistor varies in a decreasing direction, an increase of the monitor current IR can be suppressed to some extent, so that the decrease in the delay time can be suppressed. Accordingly, it is possible to correct the process fluctuation of the low Vt transistor so that the fluctuation of the delay time is reduced as a whole.

Figure 7:
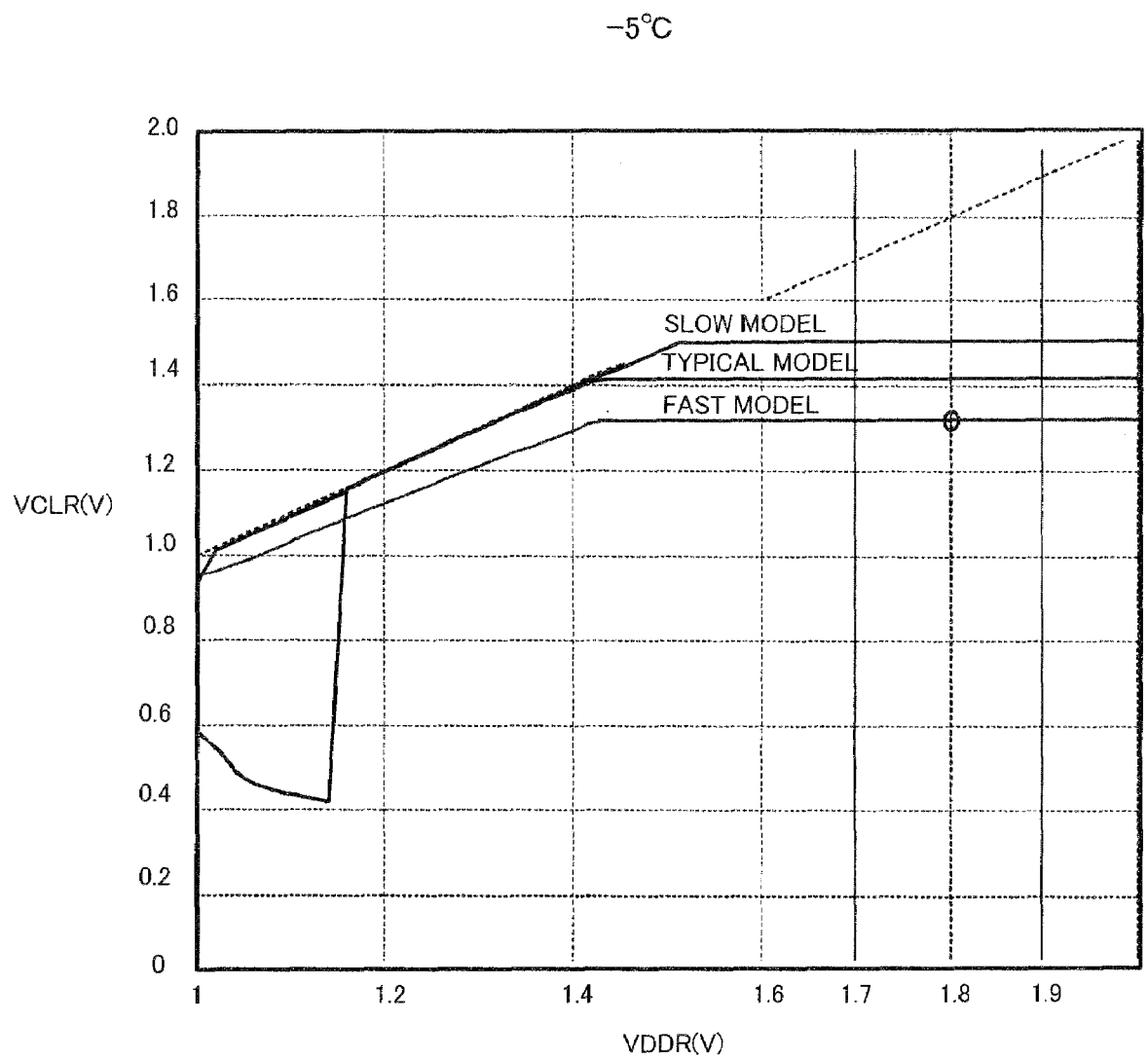
FIG. 7 is a diagram explaining an influence of a reference voltage VCLR at −5 degree in the reference voltage generating circuit.
Figure 8:
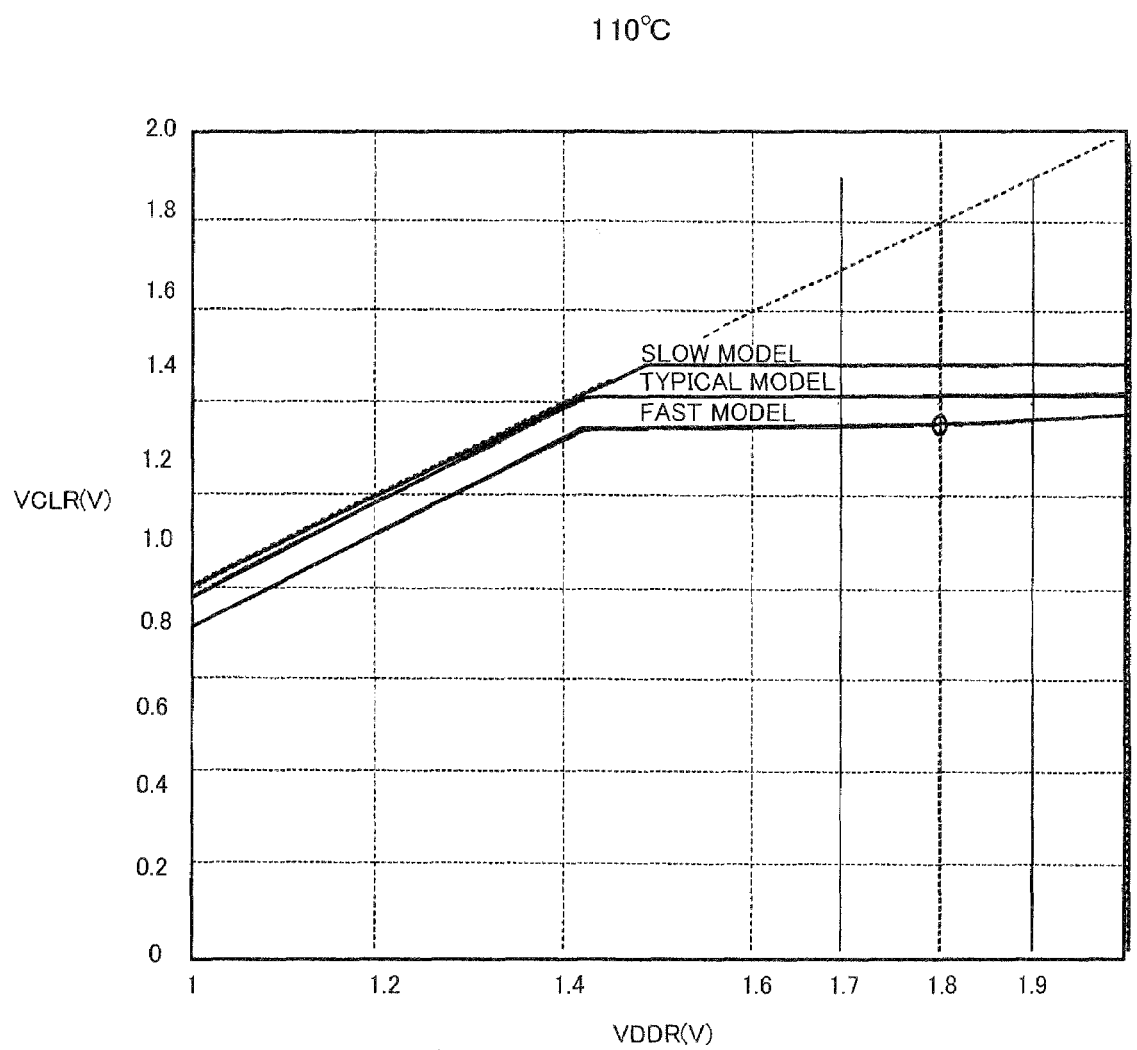
FIG. 8 is a diagram explaining an influence of the reference voltage VCLR at 110 degree in the reference voltage generating circuit.

Next, an influence due to power fluctuation of the reference voltage VCLR in the reference voltage generating circuits 12 and 13 will be described using FIGS. 7 to 8. In the configuration of FIG. 3, the power supply voltage VDDR is supplied to each part of the reference voltage generating circuit 12, and the fluctuation of the voltage value also needs to be considered regarding the power supply voltage VDDR. For example, the fluctuation of the power supply voltage VDDR is assumed to be centered at 1.8V with in a range of ±0.1V (1.7 to 1.9V). FIGS. 7 and 8 show characteristics of the reference voltage VCLR relative to the fluctuation of the power supply voltage VDDR regarding the above three models in a case where the monitor circuit 20 is configured according to the above design conditions. FIG. 7 shows characteristics at −5 degree, and FIG. 8 shows characteristics at 110 degree.

In FIGS. 7 and 8, the reference voltage VCLR is stable regardless of the fluctuation of the power supply voltage VDDR except within a range where the power supply voltage VDDR is sufficiently low. The reference voltage VCLR maintains 1.5V in the slow model, 1.4V in the typical model, and 1.3V in the fast model, respectively in a range where the power supply voltage VDDR exceeds 1.5V. Accordingly, it is understood that the fluctuation in a range where the power supply voltage VDDR is between 1.7V and 1.9V does not affect the reference voltage VCLR.

Figure 9:
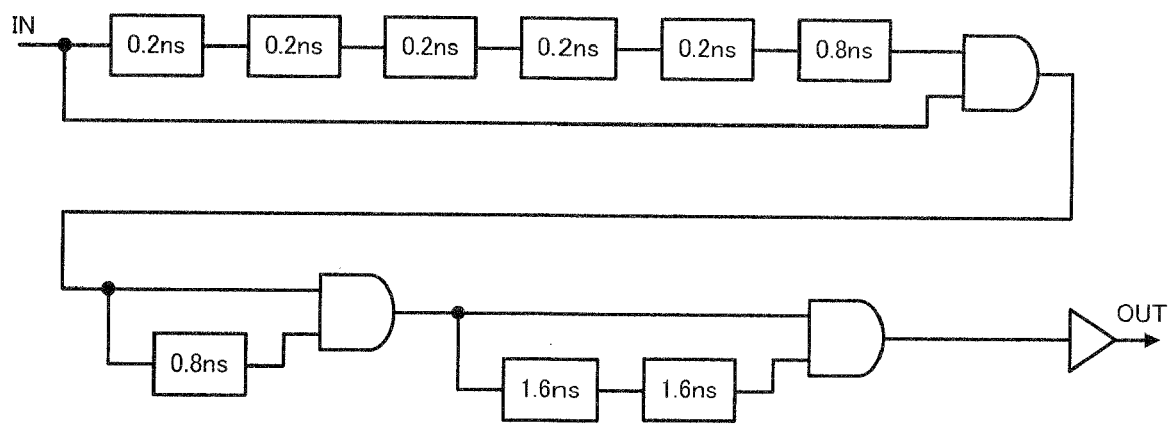
FIG. 9 is a diagram showing a configuration example of a delay circuit used to select a word line in the DRAM.

Effects of the configuration of the embodiment applied to a delay circuit as an internal circuit including the low Vt transistors will be described using FIGS. 9 to 11. For example, a delay circuit included in a configuration for selecting a word line in a DRAM requiring a severe delay time is assumed. FIG. 9 shows a configuration example of the delay circuit of the DRAM. The delay circuit as shown in FIG. 9 is configured by a plurality of delay elements connected in multiple stages, each of which has a delay time such as 0.2 ns, 0.8 ns, 1.6 ns, and the delay circuit includes AND gates and a buffer. A total delay time from an input (IN) to an output (OUT) in the delay circuit is an accumulation of delay times of the plurality of delay elements and other elements.

Each of the plurality of delay elements in FIG. 9 includes a pair of the low Vt (PMOS and NMOS) transistors connected in series (not shown) as the same in the monitor circuit 20 of FIG. 3, and the internal power supply voltage VCL is supplied thereto. Since the delay circuit is implemented in the same chip as the monitor circuit 20, the process fluctuations of the low Vt transistors having the same structure match one another. Further, since the internal power supply voltage VCL is generated based on the reference voltage VCLR of FIG. 3, they have the same voltage value. Accordingly, the delay time of each delay element of the delay circuit changes as a reflection of the operating condition of the low Vt transistor of the monitor circuit 20 within a temperature range between −5 and 110 degree. As a result, the fluctuation of the delay time due to the delay circuit in word line select operation can be sufficiently suppressed.

Simulation results of the delay time of the delay circuit shown in FIG. 9 will be described using FIGS. 10 and 11. FIG. 10 shows a graph of a relation between the internal power supply voltage VCL of the delay circuit of FIG. 9 and the delay time for the respective three models as shown in FIG. 5 under two temperature conditions of −5 and 110 degree. In order to compare with FIG. 10, FIG. 11 shows changes in the delay time in a case where the delay circuit of FIG. 9 is configured using the standard Vt transistors as in the conventional configuration.

Figure 10:
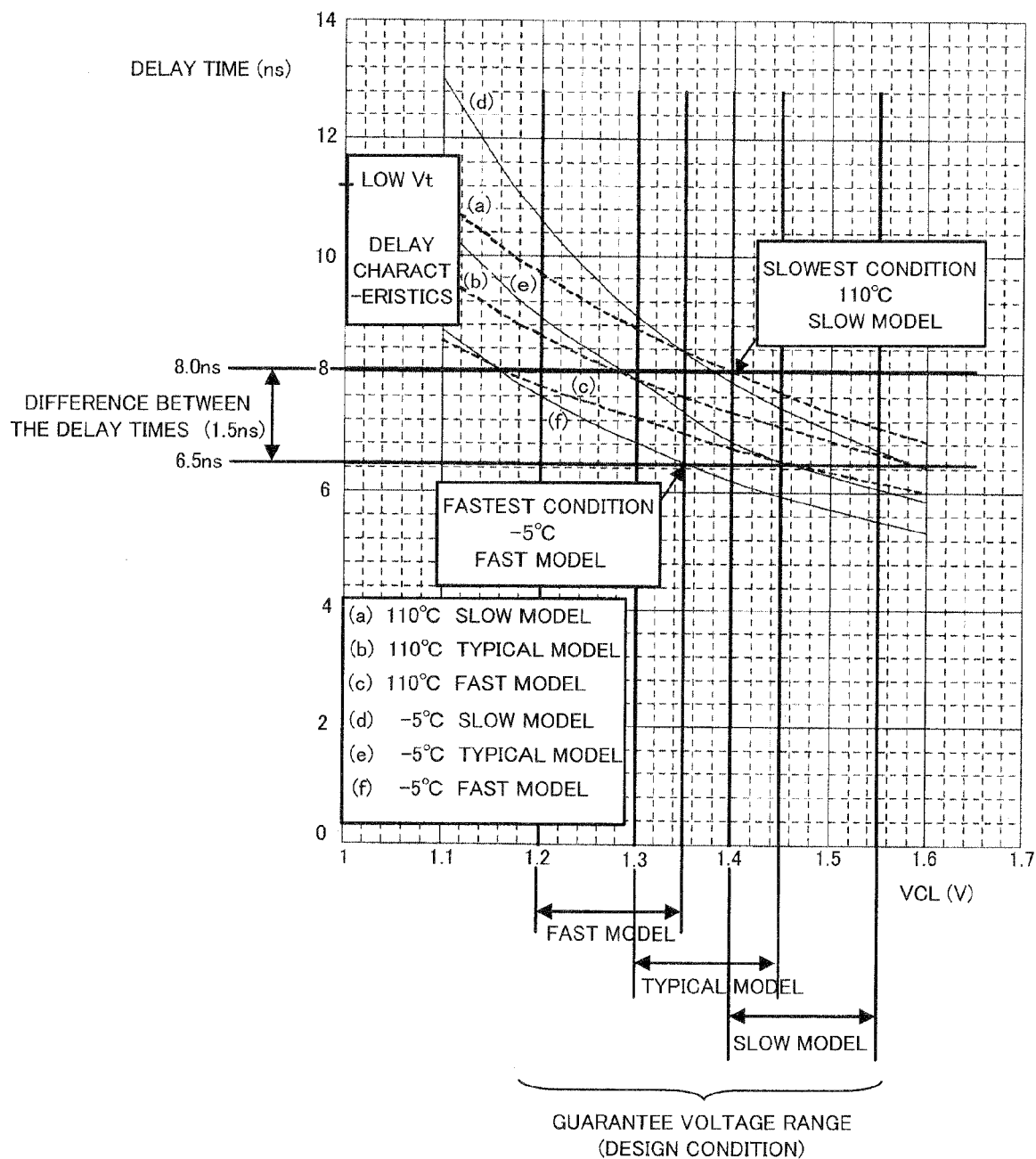
FIG. 10 is a diagram explaining simulation results of the delay time of the delay circuit of FIG. 9.

In FIG. 10, six simulation results represented by curves (a) to (f) are compared, in which the temperature conditions and the three models are combined. Here, regarding the fast model, the typical model and the slow model, a guarantee voltage range in designing is required to be set to −0.1V/+0.05V for the respective voltage values 1.3V, 1.4V and 1.5V of the reference voltage VCLR shown in FIG. 5. Therefore, the guarantee voltage range is set between 1.2V and 1.35V for the fast model, set between 1.3V and 1.45V for the typical model, and set between 1.4V and 1.55V for the slow model, respectively. Accordingly, lower and upper limits of the delay time within the guarantee voltage range of the respective models may be compared in the simulation results of FIG. 10.

As a result, a condition to maximize the delay time (slowest condition) coincides with an intersection of VCR=1.4V on the curve (a) corresponding to a temperature of 110 degree in the slow model. Further, a condition to minimize the delay time (fastest condition) coincides with an intersection of VCR=1.35V on the curve (f) corresponding to a temperature of −5 degree in the fast model. Since the delay time is 8.0 ns for the slowest condition and 6.5 ns for the fastest condition, the difference therebetween is 1.5 ns.

Figure 11:
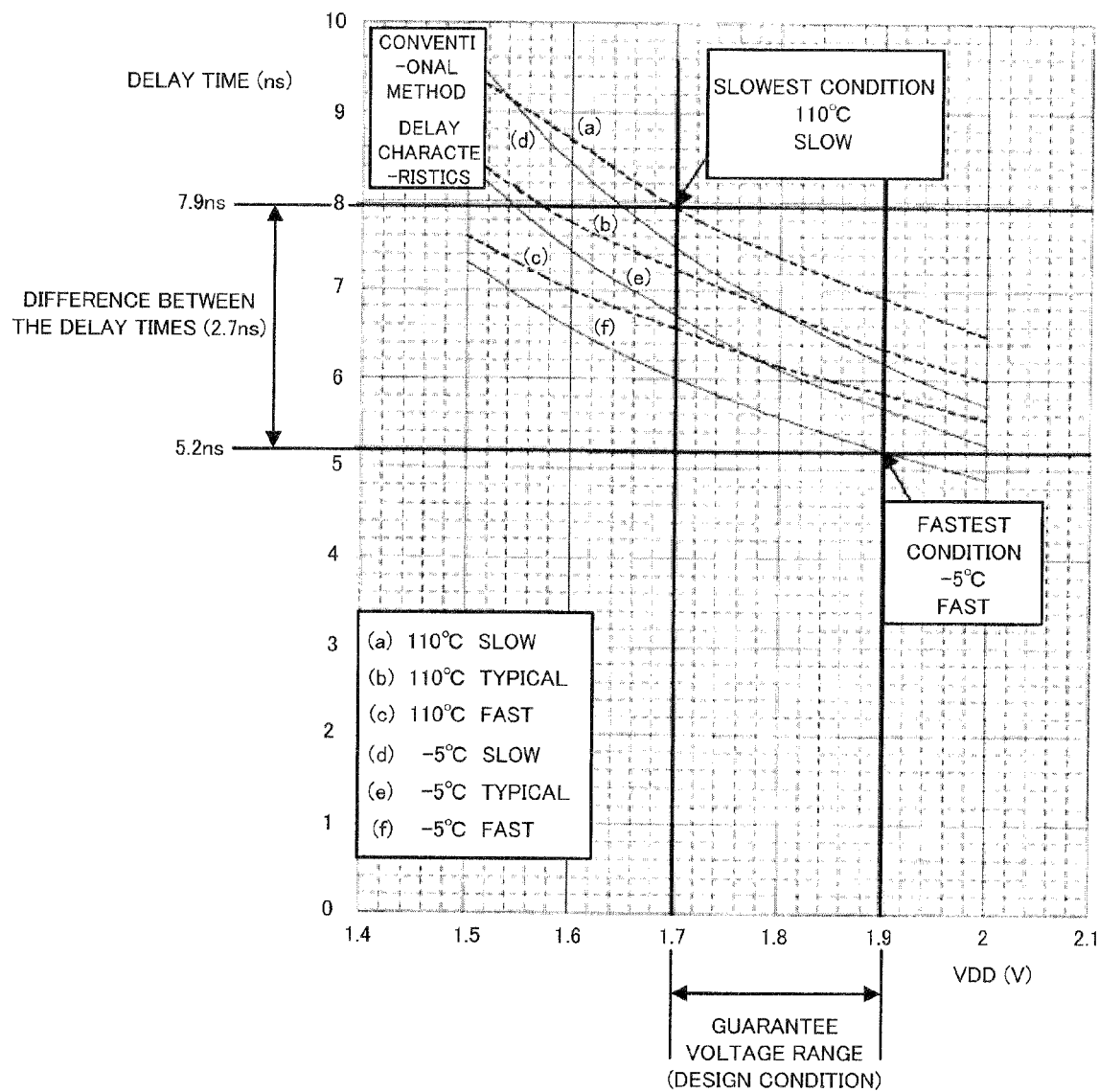
FIG. 11 is a diagram showing changes in the delay time in comparison with FIG. 10 in a case where the delay circuit of FIG. 9 is configured using conventional standard Vt transistors.

Meanwhile, in FIG. 11, an external power supply voltage VDD is assumed to be supplied to the conventional delay circuit using the standard Vt transistors, and the guarantee voltage range in designing is assumed to be centered at 1.8V and within a range between 1.7V and 1.9V. Further, regarding two temperature conditions of −5 and 110 degree, and regarding three fluctuations of characteristics of the delay time of the standard Vt transistor ("slow", "typical", "fast"), respective relations between the external power supply voltage VDD and the delay time are shown in a graph, and six simulation results represented by curves (a) to (f) are compared. In this case, lower and upper limits of the delay time within the guarantee voltage range between 1.7V and 1.9V for the external power supply voltage VDD may be compared in the simulation results of FIG. 11.

As a result, a condition to maximize the delay time (slowest condition) coincides with an intersection of VDD=1.7V on the curve (a) corresponding to a temperature of 110 degree for the "slow". Further, a condition to minimize the delay time (fastest condition) coincides with an intersection of VDD=1.9V on the curve (f) corresponding to a temperature of −5 degree for the "fast". Since the delay time is 7.9 ns for the slowest condition and 5.2 ns for the fastest condition, the difference therebetween is 2.7 ns. In this manner, by employing the configuration of the embodiment, the difference (fluctuation) between the delay times in the delay circuit is drastically reduced from 2.7 ns in FIG. 11 to 1.5 ns in FIG. 10.

Next, in a normal operation of the DRAM to which the embodiment is applied, effects based on the circuit configuration of the principal part corresponding to the low Vt transistors shown in FIG. 1 will be described using FIGS. 12 and 13. Delay characteristics of bit line select operation (FIG. 12) and bit line precharge operation (FIG. 13) will be described each as the normal operation of the DRAM, in which the delay time is a problem. In FIGS. 12 and 13, the delay characteristics of the conventional configuration using the standard Vt transistors is shown in comparison with the embodiment.

FIG. 12A shows a comparison of delay times for each delay element regarding the delay characteristics in a case where the configuration of the embodiment is employed in an access path for the bit line select operation. The delay characteristics for four conditions (slow model/−5 degree, slow model/110 degree, fast model/−5 degree, fast model/110 degree) corresponding to the models and the temperature conditions are shown in the case of the embodiment. On the other hand, the delay characteristics for two conditions (slow/110 degree, fast/−5 degree) corresponding to the characteristics variations of the standard Vt transistors and the temperature conditions are shown in the case of the conventional configuration. In this case, the two conditions of the conventional configuration correspond to the result of FIG. 11 (the slowest and fastest conditions). The voltage condition is set to VDD=1.7V for the "slow" and set to VDD=1.9V for the "fast" respectively based on the result of FIG. 11. In addition, the external power supply voltage VDD of the embodiment is set to VDD=1.7V for the slow model and set to VDD=1.9V for the fast model, in order to fit the conventional configuration.

The bit line select operation can be divided into elements consisting of bank selection, X decoder input, word line selection, sense amplifier start-up, and bit line selection, and respective delay times (T1, T2, T3, T4 and T5) are indicated for the six conditions. A sum Ta1 of the delay times is obtained by Ta1=T1+T2+T3+T4+T5, and the read timing is determined to precede the completion timing of the bit line select operation by a time T6, so that tRCD (active to read) can be calculated by tRCD=Ta1−T6.

FIG. 12B is a diagram showing the sum Ta1 of the delay times included in the result of FIG. 12A, which are compared in a graph. As shown in FIG. 12B, a difference D1=4.0 ns of the delay times in the embodiment and a difference D2=7.3 ns of the delay times in the conventional configuration are obtained. In this manner, the difference of the delay times due to the process fluctuation and the temperature fluctuation can be reduced in the DRAM to which the embodiment is applied, and thereby the error of the access time of the DRAM can be reduced.

Next, FIG. 13A shows a comparison of delay times for each delay element regarding the delay characteristics in a case where the configuration of the embodiment is employed in an access path for the bit line precharge operation. Here, under the same condition as FIG. 12A, the delay characteristics for the four conditions of the embodiment and the two conditions of the conventional configuration are shown. The bit line precharge operation is divided into elements consisting of bank selection, X decoder control, precharge control, and bit line precharge, and respective delay times (T11, T12, T13 and T14) are indicated. Further, a sum Ta2=T11+T12+T13+T14, a time T15 determining a timing to turn off the precharge control, and a time tRP (precharge to read) which is calculated using the above times by tRP=Ta2−T15 are shown.

FIG. 13B is a diagram showing the sum Ta2 of the delay times included in the result of FIG. 13A, which are compared in a graph. As shown in FIG. 13B, a difference D11=4.4 ns of the delay times in the embodiment and a difference D12=6.6 ns of the delay times in the conventional configuration are obtained. In this manner, the difference of the delay times due to the process fluctuation and the temperature fluctuation can be reduced in the DRAM to which the embodiment is applied, in the bit line precharge operation as well as the bit line select operation.

As described above, in the semiconductor integrated circuit device such as the DRAM which employs the configuration of the present invention, the reference voltage VCLR is automatically corrected appropriately by the operation of the monitor circuit 20 when there is the process fluctuation. Thereby, the fluctuation of the delay time of the internal circuit including the low Vt transistor, to which the internal power supply voltage VCL is supplied, can be reduced, and the fluctuation of the delay time due to the temperature fluctuation and the power fluctuation can be also reduced. Particularly, by applying the present invention to the internal circuit including an access path in the semiconductor memory such as the DRAM, it is advantageous that the fluctuation of the delay time is suppressed to reduce the error of the access time.

Although, the configuration in which the temperature is detected as a binary value by the temperature sensor circuit 11, and the two voltage generating circuits 12 and 13 adjusted corresponding to high and low temperatures are provided has been described, the present invention is not limited to such a configuration and a configuration for detecting the temperature with more multiple steps may be employed. In this case, a plurality of reference voltage generating circuits adjusted for respective steps of detecting the temperature may be provided and selectively operated. Further, the present invention is not limited to the configuration of the embodiment, and may be applied to a configuration in which the temperature sensor circuit 11 is not provided if the temperature fluctuation does not affect and one reference voltage generating circuit adjusted according to the process fluctuation is provided.

The present invention is not limited to the above described embodiments, and various variations and modifications may be possible without departing from the scope of the present invention.

This application is based on the Japanese Patent application No. 2007-013178 filed on Jan. 23, 2007, entire content of which is expressly incorporated by reference herein.

What is claimed is:

1. A reference voltage generating circuit comprising:
a monitor circuit including a series circuit of a first transistor of a first conductivity type, a second transistor of a second conductivity type and a resistor having a predetermined resistance, and including an output node extracted from one end of said series circuit; and
an additional circuit including a third transistor of the first conductivity type and a fourth transistor of the second conductivity type, supplying a monitor current to said monitor circuit, and maintaining another end of said series circuit to a first substantially constant voltage which is not affected by a characteristic variation by production deviation,
wherein a reference voltage outputted from said output node is corrected within a range corresponding to the production deviation of the first and second transistors from a predetermined center value,
a threshold voltage of the first transistor is lower than a threshold voltage of the third transistor,
and a threshold voltage of the second transistor is lower than a threshold voltage of the fourth transistor.

2. The reference voltage generating circuit according to claim 1, wherein said additional circuit further includes a fifth transistor controlling the first constant voltage of said another end to a sane voltage as a third constant voltage generated from a third reference voltage generating circuit which is not affected by temperature and production deviations, and the fifth transistor is connected between said one end and a predetermined power supply.

3. The reference voltage generating circuit according to claim 2, wherein said additional circuit compares the first constant voltage and the third constant voltage and generates a first control voltage to control a gate voltage of the fifth transistor corresponding to a comparison result.

4. The reference voltage generating circuit according to claim 1, wherein sizes of the first and second transistors are adjusted beforehand so that a voltage value of the reference voltage is increased by a predetermined amount when operation delay is increased due to the production deviation while the voltage value of the reference voltage is reduced by a predetermined amount when the operating delay is reduced due to the production deviation.

5. The reference voltage generating circuit according to claim 4, wherein the first and second transistors have commonly connected gates and commonly connected drains.

6. A semiconductor integrated circuit device comprising:
an internal circuit to which an internal power supply voltage is supplied, the internal circuit including a low threshold voltage transistor which is a transistor having a threshold voltage lower than a standard transistor having a standard threshold voltage;
a temperature sensor circuit detecting a temperature within a predetermined temperature range; and
a plurality of reference voltage generating circuits each adjusted corresponding to the temperature detected by said temperature sensor circuit, and each generating a reference voltage used as a reference for said internal circuit,
wherein each of said plurality of reference voltage generating circuits includes:
a monitor circuit including a series circuit of a first transistor of a first conductivity type, a second transistor of a second conductivity type and a resistor having a predetermined resistance, and including an output node extracted from one end of said series circuit; and
an additional circuit including a third transistor of the first conductivity type as the standard transistor and an fourth transistor of the second conductivity type, supplying a monitor current to said monitor circuit, and controlling another end of said series circuit to a first constant voltage which is not affected characteristic variation by production deviation,
a reference voltage outputted from said output node is corrected within a range corresponding to the production deviation of a voltage value of the first and second transistors from a predetermined center value,
a threshold voltage of the first transistor is lower than a threshold voltage of the third transistor,
and a threshold voltage of the second transistor is lower than a threshold voltage of the fourth transistor.

7. The semiconductor integrated circuit device according to claim 6, further comprising a selector,
wherein the selector selects one of a plurality of reference voltages outputted as a reference voltage used as a reference for said internal circuit from said plurality of reference voltage generating circuits, corresponding to temperature detected by said temperature sensor circuit.

8. The semiconductor integrated circuit device according to claim 6, wherein said internal circuit includes a delay circuit including the low threshold voltage transistor to which the internal power supply voltage is supplied.

9. The semiconductor integrated circuit device according to claim 6, further comprising a memory circuit storing data, wherein said internal circuit is a circuit including an access path to said memory circuit.

10. The semiconductor integrated circuit device according to claim 6,
wherein said temperature sensor circuit detects the temperature as a binary value with a boundary at a predetermined temperature,
said plurality of reference voltage generating circuits includes a first reference voltage generating circuit adjusted corresponding to low temperatures and a second reference voltage generating circuit adjusted corresponding to high temperatures,
the first reference voltage generating circuit is operated when a low temperature is detected by the temperature sensor circuit,
and the second reference voltage generating circuit is operated when a high temperature is detected by the temperature sensor circuit.

11. The semiconductor integrated circuit device according to claim 10, wherein the resistance of the resistor and sizes of the first and second transistors are different between the first and second reference voltage generating circuits.

12. The semiconductor integrated circuit device according to claim 10, wherein in each of the first and second reference voltage generating circuits, sizes of the first and second transistors are adjusted beforehand based on the resistance of the resistor.

13. The semiconductor integrated circuit device according to claim 6, wherein said additional circuit further includes a fifth transistor controlling the first constant voltage of said another end to a same voltage as a third constant voltage generated from a third reference voltage generating circuit which is not affected by temperature and production deviations, and the fifth transistor is connected between said one end and a predetermined power supply.

14. The semiconductor integrated circuit device according to claim 13, wherein said additional circuit compares the first constant voltage and the third constant voltage and generates a first control voltage to control a gate voltage of the fifth transistor corresponding to a comparison result.

15. The semiconductor integrated circuit device according to claim 14, wherein the seizes of the first and second transistors are adjusted beforehand so that the voltage value of the reference voltage is increased by a predetermined amount when operation delay is increased due to the production deviation, the voltage value of the reference voltage is reduced by a predetermined amount when the operating delay is reduced by the production deviation.

* * * * *